United States Patent [19]

Meyer

[11] Patent Number: 5,652,521
[45] Date of Patent: Jul. 29, 1997

[54] INSULATION MONITORING SYSTEM FOR INSULATED HIGH VOLTAGE APPARATUS

[75] Inventor: Thomas J. Meyer, Pinellas Park, Fla.

[73] Assignee: Square D Company, Palatine, Ill.

[21] Appl. No.: 574,878

[22] Filed: Dec. 19, 1995

[51] Int. Cl.$^6$ .................................................. G01R 31/12
[52] U.S. Cl. ........................... 324/551; 324/541; 324/601; 361/63; 340/647
[58] Field of Search .................................... 324/509, 510, 324/511, 522, 529, 541, 544, 551, 552, 118, 126, 601; 340/647, 650; 361/42, 57, 63, 64, 65

[56] References Cited

U.S. PATENT DOCUMENTS

| | | | |
|---|---|---|---|
| 4,264,861 | 4/1981 | Radu et al. | 324/118 X |
| 4,385,271 | 5/1983 | Kurtz et al. | 324/509 X |
| 4,757,263 | 7/1988 | Cummings et al. | 324/552 |
| 4,896,115 | 1/1990 | LeMaitre et al. | 324/551 |
| 5,117,191 | 5/1992 | Saigo | 324/544 |
| 5,132,629 | 7/1992 | Clinton | 324/551 |
| 5,469,067 | 11/1995 | Endoh | 324/551 |
| 5,471,144 | 11/1995 | Meyer | 324/551 |
| 5,573,378 | 11/1996 | Meyer | 324/541 |

Primary Examiner—Kenneth A. Wieder
Assistant Examiner—Diep Do
Attorney, Agent, or Firm—Michael J. Femal; Richard J. Graefe; Larry I. Golden

[57] ABSTRACT

A non-ferrous current sensor is used to continuously measure the charging current magnitude in step-graded foil and paper insulation systems and capacitive insulation systems used on high voltage measurement and control apparatus such as instrument transformers and on the condenser bushings of power transformers and circuit breakers. The low voltage measured signal is conditioned by an electronic circuit that modulates a DC signal in a system current control loop to provide continuous remote monitoring and alarm functions. Remote power is supplied to the sensor and conversion circuits through the current loop. The sensor detects changes in the charging current through the insulation ground conductor, indicating the degradation of the dielectric properties between the foil layers. The sensor and associated electronic circuitry are enclosed in a housing adaptable to be used with a capacitance tap common to high voltage measurement and control apparatus. A test tap allows a calibration control module to inject various current levels through the sensing circuits that allow for calibrating the overall system to a specific high voltage apparatus.

16 Claims, 9 Drawing Sheets

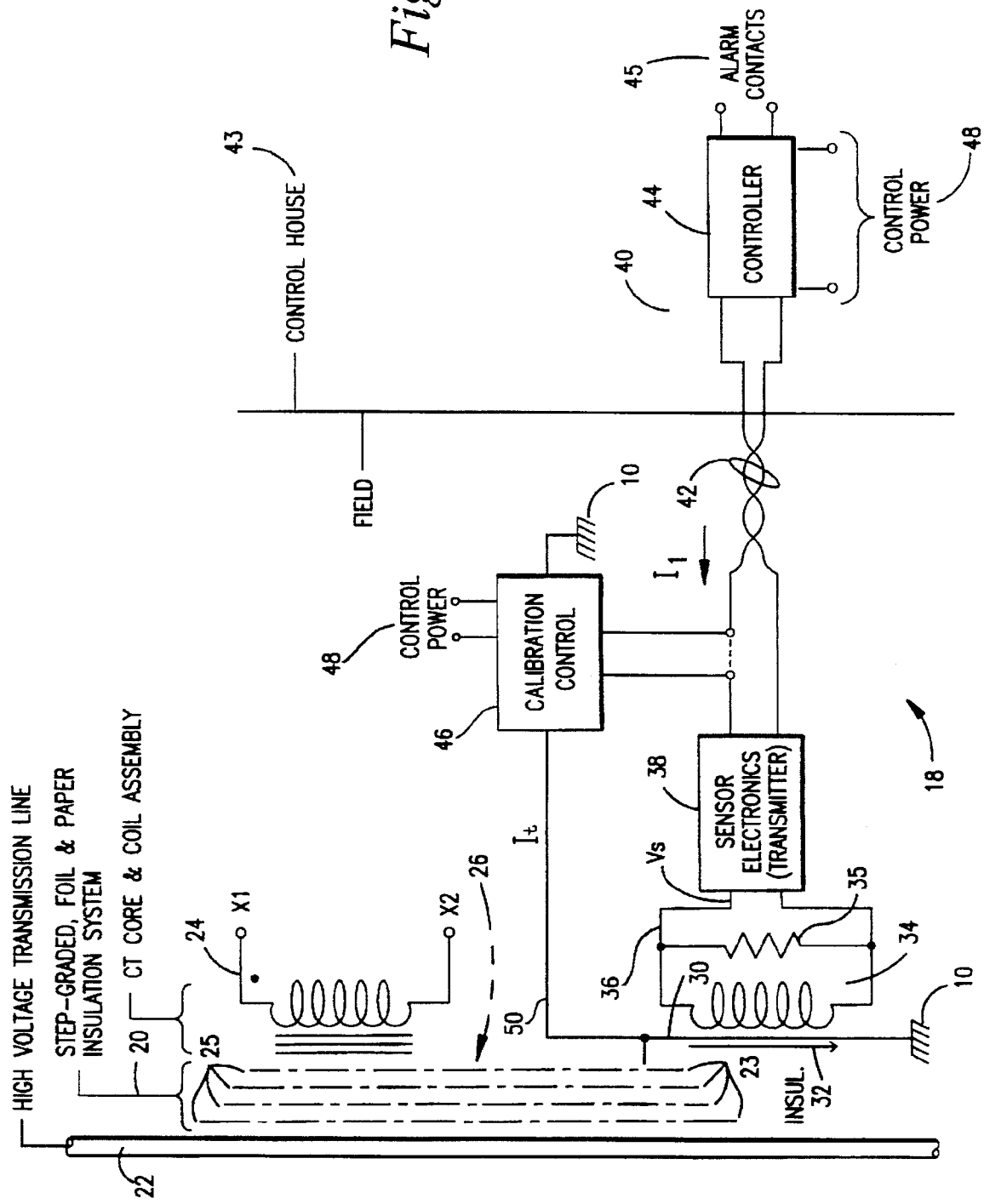

INSULATION MONITORING SYSTEM FOR INSULATED HIGH VOLTAGE APPARATUS

TECHNICAL FIELD

Applicant's invention relates generally to a system which monitors and measures the insulation status with respect to earth ground of a high voltage electrical network and more particularly to a system that quantitatively measures the capacitively coupled charging current in a step-graded paper and foil or capacitive insulation system to produce a signal output proportional to the current for continuous monitoring and alarm level detection to indicate the possibility of failure for the entire insulating system.

RELATED APPLICATIONS

This application is related to the following, commonly assigned application filed on Dec. 15, 1994, U.S. application Ser. No. 08/127,207, Pat. No. 5,471,144, entitled "INSULATION MONITORING SYSTEM FOR INSULATED HIGH VOLTAGE APPARATUS." The contents of this application are expressly incorporated herein by reference.

BACKGROUND ART

Step-graded foil and paper insulation systems and capacitive insulation systems are generally employed on high voltage measurement and control apparatus such as current transformers for the purposes of protecting personnel from shock hazard and electrical instrumentation from equipment damage. An example of a step-graded system comprises multiple alternating conductive and dielectric layers, with the conductive layer of least potential being earth grounded. The alternate layers are used to form an effective series capacitive divider circuit between the high voltage conductors and ground potential. These alternate layers are usually made from foil and paper. The paper dielectric is usually oil impregnated and is generally used in oil-filled instrument transformers, power transformers, condenser bushings and other apparatus for high voltage electrical power systems. Some SF6 gas insulated systems use a metallized film type of capacitive insulation.

Most step graded insulation and capacitive insulation systems are designed such that the capacitance of each pair of alternate layers is equal, thus producing an equal voltage stress on the dielectric between each conductive layer when the apparatus is energized at high voltage. In designs where each layer is of equal capacitance, the total capacitance of the insulation system is equal to the layer capacitance divided by the total number of layers. A charging current through the capacitive circuit exists and is directly proportional to the product of the line voltage, the line frequency, and the total capacitance. With the line voltage and frequency relatively constant, changes in the insulation charging current are due primarily to a degradation in the insulation system. Electrical breakdown between layers results in degradation of the oil purity which leaves carbon deposits, providing a conductive path which effectively constitutes a short circuit between adjacent foil layers. The total capacitance of an insulator exhibiting such degradation increases as the effective number of layers is reduced. This increase in total capacitance will increase the charging current. Furthermore, each of the remaining layers is subjected to an increase in voltage stress. Ultimately, as additional layers break down, the residual voltage stress between the remaining layers may exceed safe operating levels, leading to the eventual, often catastrophic, failure of the entire insulation system.

Conventional high voltage measurement and control equipment which employ foil and paper step-graded or capacitive insulation offer no inherent means for monitoring the insulation charging current. Methods have been developed for monitoring the condition of the insulation apparatus. Most of them employ off-line methods. A power factor test requires that the system be energized with a test voltage and changes in the measured power factor or capacitance over time are recorded to see if there are any significant changes that would indicate a shorted layer. Partial discharge methods are effective in detecting these changes, but must be performed off-line and may not be practical in installations where interruption of service is not economical. Another method, gas-in-oil analysis, requires an oil sample to be drawn and tested to determine the presence of various gas that are generated when the apparatus overheats, usually indicative of a breakdown of the insulation. Some other prior art systems employ a measuring resistor in series with the ground loop and measure the voltage generated by the leakage current. However, direct measurement of this voltage is often misleading due to the lack of compensating networks to overcome the influence of the capacitance of the insulation and effects of electrical interference. Sensing the insulation charging current may not be satisfactorily accomplished by means of a resistive series element in the grounded electrode or by means of a ferrous magnetic core device. In either the resistive or ferro-magnetic sensing method, the capacitive nature of the insulation circuit between the high voltage conductor and ground is disturbed by a resistive or inductive sensor to the point where the magnitude of the insulation current is altered. Other methods inject a current at a lower frequency than the network and detect the resultant current flow in the effective leakage resistance and capacitance. These methods, being applied off-line, are incapable of continuously monitoring for a change in the insulation charging current while the apparatus is in operation. Further, they are often intrusive to the hermetically sealed insulation common to these types of insulation systems.

Commonly assigned applications, Ser. No. 08/127,207 and 08/356,821 describe an on-line improvement over these common methods for monitoring the quality of electrical network insulation. In this system, a remote sensing coil produces a voltage output that is linearly proportional to the insulation charging current and a remote, self powered electronic circuit coupled to the sensor modulates a DC current control circuit proportionally to the output voltage of the sensor. An electronic control circuit provides a suitable voltage supply for the modulated current and alarm threshold detection circuits within the control circuit compare the output proportional voltage with predetermined levels.

A capacitance tap is an existing electrode provided on all condenser bushings used on high voltage power transformers and circuit breakers and can they also be used on current transformers. The tap provides access to the insulation capacitance for off-line testing purposes and could be used for measuring voltage on-line. The apparatus can be coupled directly to this tap for monitoring the insulation quality of the high voltage equipment. This allows for on site retrofitting of existing installations without requiring dismantling and draining of the insulating oil from the equipment.

The high voltage apparatus usually lists a nominal insulation capacitance value. Using this value, along with the operating voltage and frequency, a nominal factory calibration can be performed on the equipment. Performing this calibration in the field, which is more accurate, involves a cumbersome set of instruments and interconnecting wires.

This field calibration is oftentimes required since there are several other factors that determine the final or ultimate capacitance value. Small variations in the paper or foil layer thickness, oil and paper dielectric constants, moisture content, and so on will effect the system capacitance. The sensor coil itself has tolerances that could effect the accuracy of the apparatus. The final value of the capacitance can not be determined until dissipation tests have been run. These tests can not be run until after the high voltage apparatus has been filled with oil. Since the insulation monitoring system is capable of high accuracy, it is important to have it calibrated to the actual capacitance of the system, rather than calculating the insulation capacitance.

SUMMARY OF THE INVENTION

Accordingly, the principal object of the present invention is to provide an apparatus and method for calibrating a device used in the continuous, on-line, monitoring of the charging or leakage current of a step-graded or capacitive insulated high voltage apparatus.

A further objective of the invention is to provide an apparatus and method for calibrating the device having a signal proportional to the charging or leakage current with a means for installing on the high voltage apparatus without removing the high voltage apparatus from service.

In the preferred embodiment of the invention, the invention is comprised of a system of essential elements including, but not limited to, a remote sensing coil producing a voltage output linearly proportional to the insulation charging current, a remote, self powered electronic circuit coupled to the sensor which modulates a DC current control circuit proportionally to the output voltage of the sensor, an electronic control circuit providing a suitable voltage supply for the modulated current and alarm threshold detection circuits, and a calibration module for generating a series of test currents for injecting into the remote sensing coil.

The sensing coil described by the present invention utilizes a low permeability core, which may be in the form of a toroid, wound with a high number of turns to create a low inductance linear coupler from which an output voltage signal is produced which is proportional to the current in the grounded conductor passing through the center of the toroid. The linear coupler also serves to electrically isolate the sensor electronic circuits from the insulation grounding system.

The monitoring system uses a signal current modulation scheme which includes a 4 milliampere (ma) zero offset current loop from which electrical power is derived for the remote electronic circuits and which serves to indicate that the electronics are functioning properly, even in the absence of insulation current. The zero to full scale modulation of 4 to 20 ma current loop is used to conform to existing standards for auxiliary monitoring instruments, indicating meters, annunciators and alarm devices which may be series connected to the control current loop for additional supervisory and reporting capability. The midpoint between 4 ma and 20 ma is selected to represent the insulation current at its expected level for normal power system voltage and total insulation capacitance. That is, when the power system is energized at its nominal operating voltage and the total insulation capacitance has not been degraded from its intended initial value, the insulation charging current, will be equal to a nominal value for which the electronic circuits will cause an additional 8 mA to flow in the control current loop thereby causing a total of 12 ma in the loop. The electronic circuit is adjusted using the test currents from the calibration monitor such that this same insulation charging current will produce a full scale control loop current reading of 20 ma when the insulation current reaches a value equal to twice its nominal value. Due to the proportionality of the power system voltage and the insulation capacitance to the insulation charging current, a doubling of the insulation charging current at nominal power system voltage would indicate that the total insulation capacitance has achieved a level of twice its nominal value, indicating that one half of the foil and paper layers in the insulation system have become ineffective. Alarm system thresholds may then be set between the 12 ma and 20 ma control loop current levels to indicate the degree of insulation breakdown that can be tolerated before further measures are taken to investigate the condition of the insulation system.

The system controller, not an object of the present invention, includes a DC voltage source from which the remote sensor electronics power supply and the modulated control loop current are derived. The controller may also include alarm circuits, possibly including time delays, whereby alarm thresholds may be established and alarm contacts made to transfer when the control loop current exceeds predetermined adjustable limits.

In the preferred embodiment of the invention, the remote sensing coil and the monitoring system are housed in an enclosure which readily adapts to a standard capacitance tap usually provided on high voltage equipment. The enclosure assembly replaces the standard capacitance tap (cap-tap) cover used to ground the insulation system at the tap when it is not otherwise being used for test purposes. Integrated into the housing and sensing circuits is a tap that allows the test currents to be injected into through the sensing coil.

Other features and advantages of the invention, which are believed to be novel and nonobvious, will be apparent from the following specification taken in conjunction with the accompanying drawings in which there is shown a preferred embodiment of the invention. Reference is made to the claims for interpreting the full scope of the invention which is not necessarily represented by such embodiment.

BRIEF DESCRIPTION OF THE DRAWINGS

FIG. 3 is a block diagram of the essential elements of a monitoring system utilized in the present invention.

DETAILED DESCRIPTION

Although this invention is susceptible to embodiments of many different forms, a preferred embodiment will be described and illustrated in detail herein. The present disclosure exemplifies the principles of the invention and is not to be considered a limit to the broader aspects of the invention to the particular embodiment as described.

Figure 1:
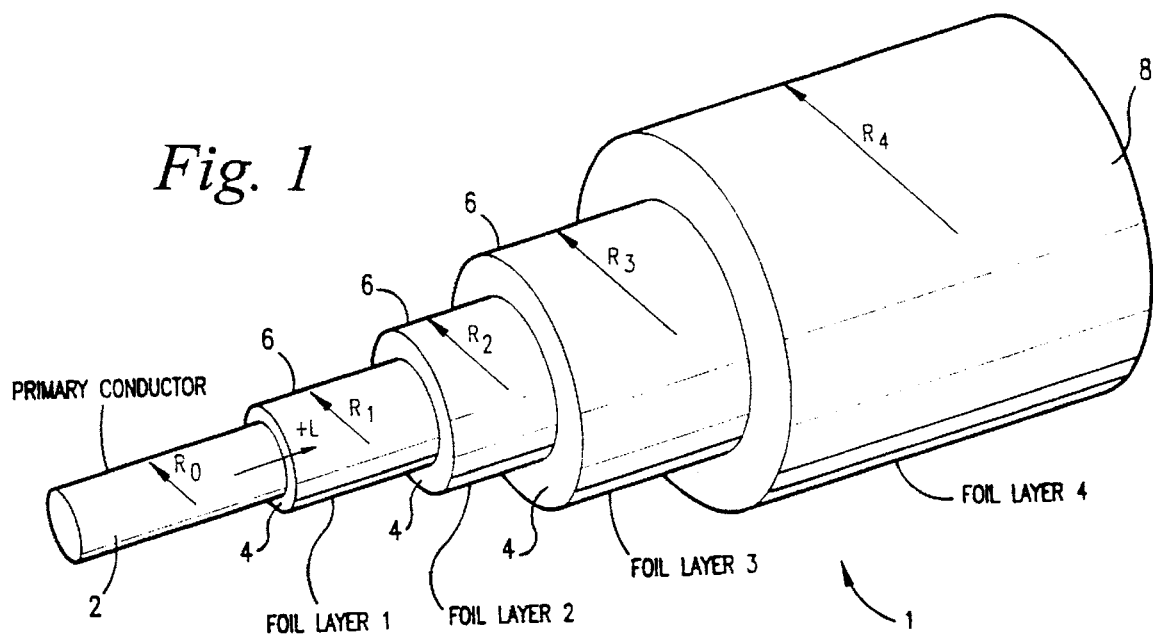
FIG. 1 illustrates the construction of a step graded foil and paper insulator showing the alternating layers of foil and paper.

FIG. 1 shows the typical construction of a step-graded paper and foil insulation system 1 where a high voltage conductor 2 is wrapped with alternating layers of dielectric material such as paper 4 and conductive material such as foil 6. Thus, as the conductive layers are added to the insulation system, the radius, R0–R4, from the high voltage conductor to the conductive layers tends to increase. The capacitance value between any two adjacent conductive layers is directly proportional to the length of the layer and inversely proportional to the LOG ratio of the outside to inside radius of the layer. In order to maintain equal capacitance values from layer to layer, the length of each conductive layers is adjusted to account for the radial buildup. This construction serves to insulate the outermost layer 8, usually at ground potential, from the high voltage conductor 2.

Figure 2:
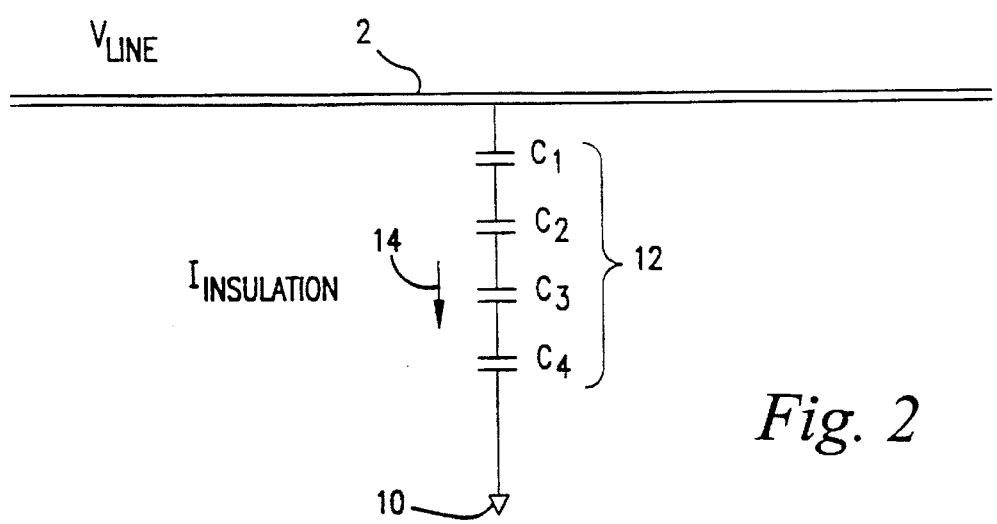
FIG. 2 is an electrical schematic of a capacitive divider circuit formed by the insulation structure of FIG. 1.

A simplified electrical schematic diagram of the insulation system 1 as it forms a series capacitance circuit from the high voltage conductor 2 to ground 10 is shown in FIG. 2. With the number of capacitors equal to the total number of foil layers, a capacitive voltage divider 12 is formed. The total capacitance of the series capacitors, with equal valued capacitors, is equal to the layer capacitance divided by the number of layers. The actual equivalent circuit will consist of many parallel capacitors created by the capacitances that exists between noncandidate layers. The electrical current 14, also called the charging current, which flows through the capacitor circuit is proportional to the layer capacitance divided by the number of layers. The actual equivalent circuit will consist of many parallel capacitors created by the capacitances that exists between noncandidate layers. The electrical current 14, also called the charging current, which flows through the capacitor circuit is proportional to the voltage of the high voltage conductor 2 and the total capacitance 12, based on the relationship that $$I = Vline * j\omega * Ctotal$$

where $1/Ctotal = 1/C1 + 1/C2 + 1/C3 + \ldots + 1/Cn$
and $Ctotal = Cn/n$
for $Cn = C1 + C2 + C3 + \ldots + Cn$ On a typical 345 kV high voltage current transformer, the total capacitance may be approximately 705 pf. Operating on a 345 kV line, the line to ground voltage is about 200 kV and the charging current 14 is nominally 53 mA. Under normal operating conditions, the high voltage AC signal 2 has a relatively constant amplitude and frequency. Thus, the charging current 14 remains relatively constant in amplitude and frequency as well. Changes in the capacitive insulation structure, however, will produce changes in the amplitude of the charging current. Using the circuit shown in FIG. 2, which represents a four layer system, as an example, a voltage breakdown between two adjacent foil layers will effectively reduce the total number of layers by 1, which in turn increases the total capacitance 12 by a factor of 1/3. This will cause a proportionate increase in the charging current 14 to over 70 mA. Although FIG. 2 only shows four layers, more typical systems will use 10 to 30 layers, depending on the voltage class of the unit.

FIG. 3 illustrates an entire insulation current monitoring system 18 in a block diagram as disclosed in the present invention. A step-graded foil and paper insulation system 20 insulates a high voltage conductor 22 from a transformer core and coil assembly 24. The step-graded insulation system includes alternate layers of dielectric material such as paper 23 and conductive material such as foil 25. The lowest potential foil layer 26 is electrically connected to ground 10 with a conductive element 30 which provides a ground path for the insulation charging current 32. A wound, non-ferrous toroidal coil assembly 34 is positioned such that the ground conductor 30 passes directly through the center of the toroidal coil, such that the coil 34 links all of the magnetic flux generated by the charging current 32 passing through the conductor 30. The non-ferrous nature of the coil assembly 34 results in a low inductance coupling back into the series capacitive circuit of the insulation 20 and, therefore, does not alter the magnitude of the charging current 32 being measured. A burden resistor 35 internal to the assembly 34 produces a voltage Vs that is proportional to the charging current 32. The coil assembly 34 also serves to electrically isolate the current monitoring system circuits 18 from the insulation grounding system. Because of the high voltage and currents associated with the system, the coil assembly will have some type of shielding to prevent inductive coupling of adjacent and unwanted magnetic fields.

The coil assembly 34 is electrically connected to a sensor electronic circuit or transmitter 38 by means of a shielded, twisted pair, or other suitable, cable 36. The transmitter 38 performs the functions of amplifying and rectifying the sensor voltage signal Vs. Output driver circuits in the transmitter 38 are used to modulate a DC current I1 in a control loop 40. The modulation results in the current signal I1 containing a proportionate magnitude of the charging current 32. The control loop 40 conforms to a standard 4–20 mA loop and cable 42, which electrically connects the transmitter 38 to a controller 44 and calibration control 46, is also a shielded, twisted pair or other suitable cable. The controller 44 may be located in a benign control house 43 environment. The control house 43 and the transmitter 38 can be separated by up to 2000 feet. The calibration control 46 is normally used for test/calibration purposes in the high voltage area and may contain a substitute controller 44.

Controller 44 performs one or more essential functions. The controller 44 includes an isolated DC voltage source, which may provide as much as 30 to 40 volts, and which has the capability of providing 20 mA full scale modulated current in the control loop 40. The current which flows from the voltage source is strictly modulated by the sensor electronics alone, yet the terminal voltage across the controller 44 output is determined by a nominal voltage level required to excite the remote power supply circuits in the transmitter 38, and by the voltage drops associated with the current in the control loop 40. The outputs of the controller 44 are alarm contacts 45 which operate at a predetermined, settable level of leakage or charging current 32 to indicate a change in the insulation charging current 32 of the insulation system 20. If a polyphase system is being monitored, the controller 44 is capable of receiving inputs from transmitters and control loops similar to transmitter 38 and control loop 40.

The insulation current monitoring system 18 is powered by control power 48 which is inputted to the controller 44 and calibration control 46. The signal current modulation scheme includes a 4 mA offset zero from which electrical power is derived for the remote transmitter 38, eliminating the need for auxiliary power at the high voltage apparatus that is being monitored. Calibration control 46 includes a self contained power supply and metering for displaying current in the current loop 40. It includes means for generating a precision test current It and metering for displaying current in the test loop. Test winding conductor 50 couples It to the conductor 30 for pickup by sensing coil assembly 34.

Figure 4A:
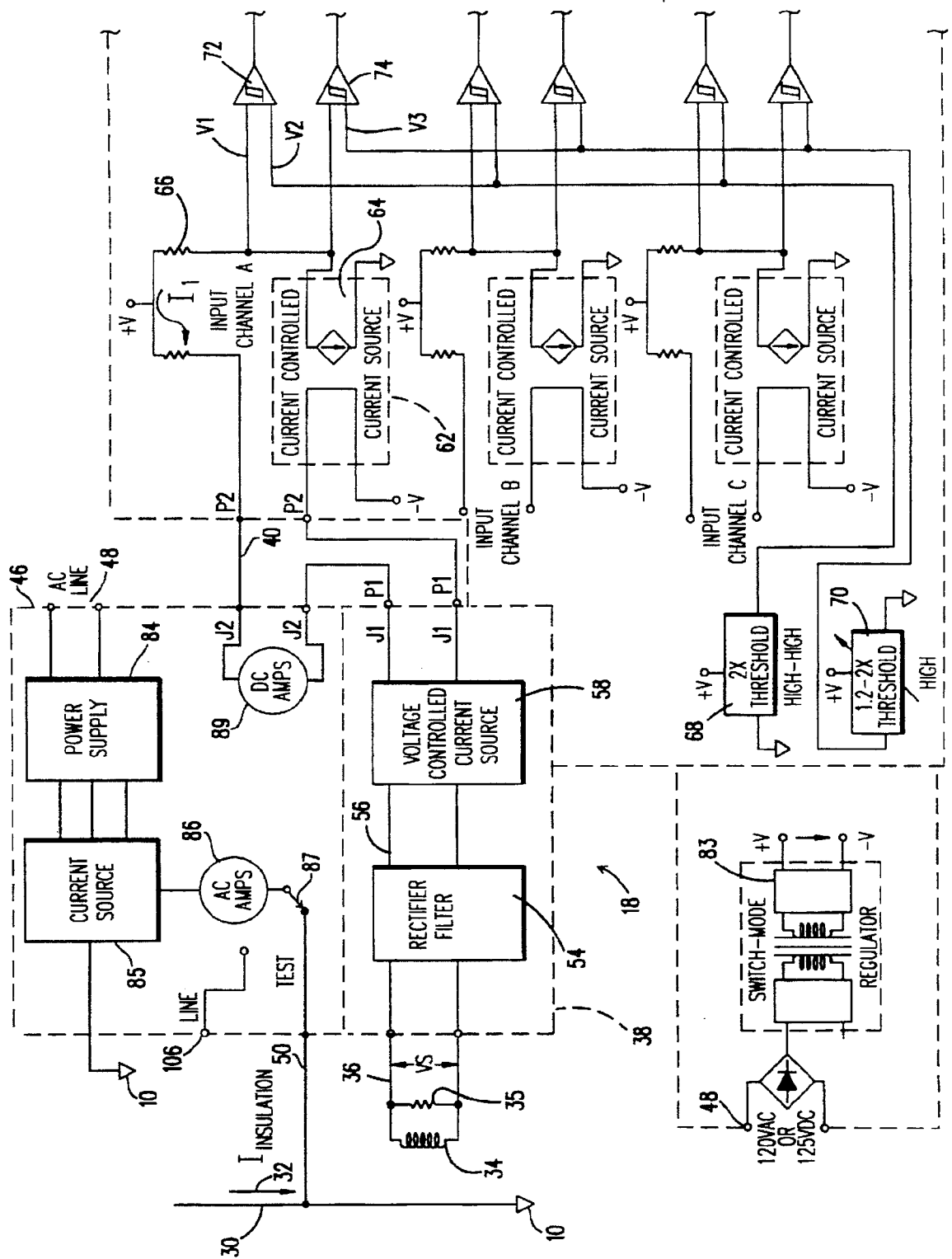
FIGS. 4a and 4b are a detailed block diagram of the monitoring system of the present invention as shown in FIG. 3.
Figure 4B:
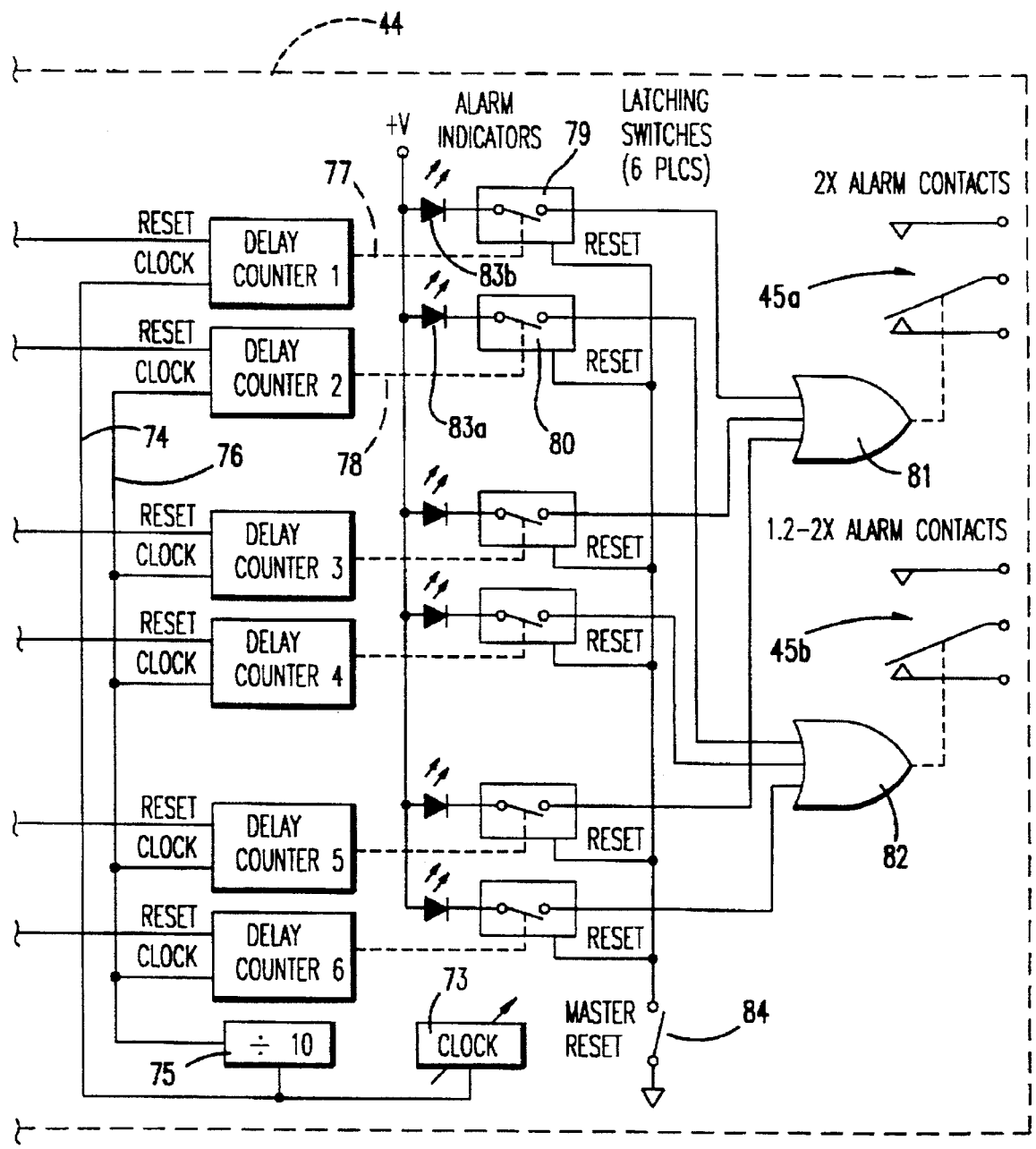

Operation of the insulation current monitoring system 18 can be best understood with reference to FIGS. 4a and 4b, which are detailed block diagrams of the preferred embodiment of an insulation current monitoring system 18 employed in the present invention. The foil layer 26 of the insulation system being monitored is coupled to ground 10 through ground lead 30 which passes through the sensing coil 34. The output voltage Vs of sensor 34 is proportional to the insulation charging current 32 and is coupled to the transmitter 38. For the low leakage currents being measured, it has been found that a proportionality factor or ratio of fifty microvolts per one milliampere of charging current provides an adequate degree of sensitivity. A combination filter, amplifier and rectifier circuit 54 develops a DC voltage signal 56 from voltage Vs that remains proportional to the charging current 32. A voltage controlled current source 58, where the generated current is proportional to the voltage 56, is used to modulate a 4–20 mA current loop 40 for inputting to channel A of controller 44. Controller 44 is shown for a three phase system, but with only phase A sensor 34 and transmitter 38 shown. Additional sensors and transmitters would be required for a three phase system. The current I1 flowing in the current loop 40 is normally coupled to the controller 44 via twisted pair cable 42, with plug P2 connected to jack J1. When the calibration control 46 is used, it is interposed between these two points, with P2 coupled to J2 and P1 coupled to J1 to complete the current loop. The current controlled current source 62 provides 4 mA of quiescent current flowing in loop 40 with zero charging current 32 when the high voltage apparatus being monitored is not energized. This quiescent current is used to provide power for the sensor 34 and transmitter 38. With the high voltage apparatus energized during initialization, usually during installation, the voltage controlled current source 58 is adjusted to provide 12 mA of loop current. This represents the expected charging current 32 when the high voltage apparatus is operating at its nominal operating voltage. Thus 100% (1×) of initial charging current equals 8 mA. Since there is a linear relationship between the charging current 32 and the loop current I1, 200% (2×) of charging current will equal 2×8 mA or 16 mA which is added to the 4 mA of quiescent current to create 20 mA of loop current I1. A current mirror 64 generates a voltage V1 across resistor 66. V1 is calibrated to be proportional to the charging current 32.

A 2× threshold level generator 68 and an adjustable 1.2–2× threshold level generator 70 generate voltage levels V2, V3, respectively. V2 is set such that voltage V1, with 20 mA of loop current I1, will equal V2. V3 is adjusted within the range 1.2–2× or 13.6–20 mA of loop current I1 for a similar relationship with V1. Schmidt trigger 71 compares V1 with V2 and will enable delay counter 1 when V1 exceeds V2, indicative of an increase in the charging current 32 to a level that is at least twice the original current resulting from a breakdown in the insulating layers of high voltage apparatus. Schmidt trigger 72 compares V1 with V3 in a similar fashion.

Since switching transients may regularly occur on the power system, voltage levels on the power system will momentarily cause the insulation charging current 32, and hence voltage V1, to increase above their steady state levels when such transient conditions occur. Delay counters 1–6 provide a predetermined delay period before initiating the transfer of the alarm contacts 45 a,b. This distinguishes between a short term occurrence of a switching voltage transient and a long term steady degradation of the insulation system as evidenced by a steady increase in the insulation charging current. Clock 73 produces a timing pulse 74 for the delay counters 1, 3, and 5, with a divide by ten circuit 75 providing timing pulse 76 having a longer time delay for counters 2, 4 and 6 that monitor the lower levels of charging current 32 in the 1.2–2× range. The clock rate for the 2× alarm level is adjustable and can provide up to 30 seconds of delay.

If the charging current 32 exceeds the 2× or adjustable thresholds 68, 70 for a period longer than the time duration of the delay counters 1–6, outputs 77 or 78, depending on which threshold was exceeded, will energize latching switches 79, 80 respectively. This will in turn energize the 2× or 1.2–2× alarm contacts 45a or 45b respectively through one of the "OR" functions 81, 82. Alarm indicators 83a or 83b will display the appropriate cause of the trip. The outputs will remain in a tripped state until a master reset 84 is operated. Latching switches 79, 80 are used to provide memory of the condition if control power 48 is interrupted at any time after a trip operation.

Channels B and C will perform in the same manner. OR 81 will operate the 2× alarm if any of the three phases exceeds the 2× level for the preset time delay period and OR 82 will operate the 1.2–2× alarm if any of the three phases exceeds that level for the other preset time delay period. Power for the system is supplied by a switchmode regulator 83, the details of which are well known and are not an object of the present invention.

The calibration control 46 consists of an internal power source 85 which supplies regulated power to current source 86. An AC ammeter 87 provides a visual current reading of the test current It. This current is coupled to the conductor 30 over cable 50 when test switch 88 is in the calibrate mode. DC ammeter 89 provides a visual indication of the loop current 40.

Figure 5:
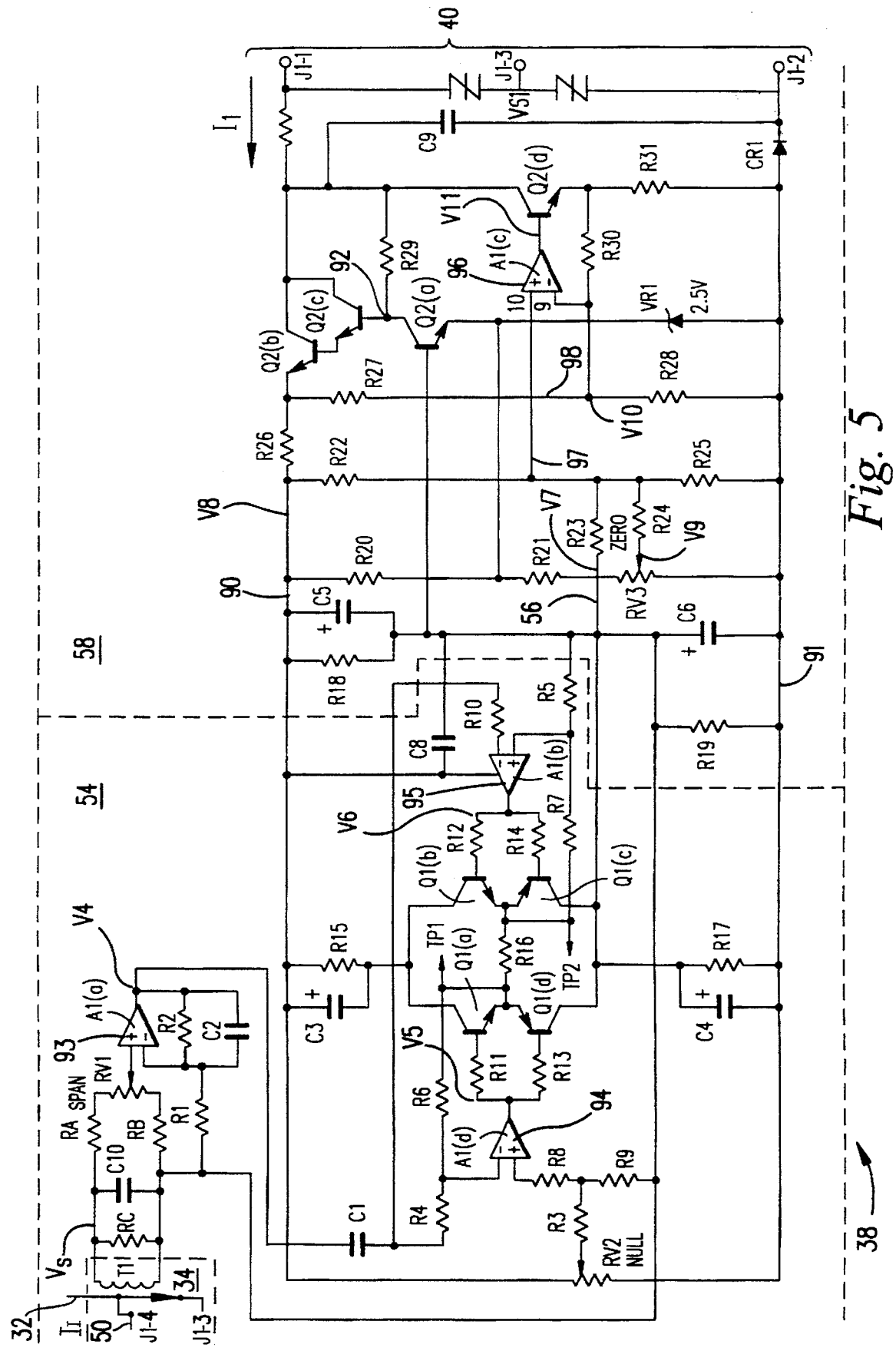
FIG. 5 is a detailed schematic diagram of the remote sensor and transmitter illustrated in FIGS. 4a and 4b.

FIG. 5 details the sensing coil 34 and transmitter 38 consisting of the rectifier circuit 54 and voltage controlled current source 58. Current loop 40 is connected to terminals J1-1 and J1-2. The 4 mA quiescent current of the loop current I1 creates a 6 volt rail between 90 and 91 through the action of zener diode VR1 and transistors Q2a, b, and c. Four mA of current flowing in the current loop 40 is sufficient to provide base drive at node 92 for darlington connected transistors Q2b and c. Transistor Q2a will conduct, allowing zener diode VR1 to also conduct, building a voltage at node 92. Regardless of any increase in the loop current, the rail voltage will remain relatively constant and regulated near the 6 volt level.

The output voltage Vs of sensor 34 which is proportional to the insulation charging current 32, is inputted to rectifier circuit 54. Changing the resistance values of resistors RA and RB provide a means for using the insulation current monitor 18 for different adjustment ranges of charging current 32, based on the magnitude of the high voltage line and the total capacitance of the insulated apparatus that the insulation current monitor 18 is monitoring. These resistors, along with SPAN potentiometer RV1, scale the incoming voltage Vs to the fixed gain of buffer amplifier 93, which can be an operational amplifier for greater temperature stability. The gain is selected such that AC output voltage V4 does not saturate at the 200% level of allowable insulation charging current 32. Since Vs is scaled to be fifty microvolts per one milliampere of charging current, the gain of amplifier 93 has to be quite high. A two stage cascaded amplifier is employed with the first stage with amplifier 93 providing half of the required gain so as to allow the full peak to peak voltage swing of Vs to be amplified within the voltage rails 90, 91. The higher gain of the first stage will also reduce the effects of the DC offset levels of the operational amplifiers on the following stages, amplifiers 94 and 95 which only will require equal but opposite polarity gains of the amplifiers 94 and 95, and the full wave rectification circuitry. Capacitor C1 couples voltage V4 to amplifiers 94 and 95 which function to generate voltages V5, V6 respectively, that are equal, but phase shifted by 180 degrees. As a result, resistor R16 becomes a load resistor that produces a full wave rectified voltage V7, which is the DC voltage signal 56 as referenced in FIG. 5a, through the alternate conduction of transistor pairs Q1a–Q1c and Q1b–Q1d. Voltage V7 is positive with respect to the voltage rail 134. RC network C4-R17 provides a DC filter for the rectified voltage V7 and the C3-R15 combination provides a balance with the positive DC rail 132. Calibration of the rectifier circuit 54 is accomplished by adjusting NULL potentiometer RV2 for zero voltage across R16 with voltage Vs not present.

The voltage controlled current source 58 portion of transmitter 38 modulates the 4–20 mA current loop 40 through the action of summing amplifier 96 and the voltages at nodes 97 and 98. The voltage at node 98 comprises voltage V7, which is proportional to the charging current 32, a current reference signal V8 derived from voltage divider R22 and R25, and an adjustable voltage offset signal V9 derived from divider R21 and RV3. The voltage at node 97 is a current sample signal V10 derived from current sense resistor R26. Amplifier 96 subtracts the voltage across R26 from the offset voltage to compensate for changes in current loading of the transmitter circuit 38 whereby the output voltage V11=V7+V8+V9–V10. The output voltage V11 provide base drive for transistor Q2d which modulates I1 in current loop 40. With no signal present at terminals J1-1, J1-2, ZERO potentiometer RV3 is adjusted to provide 4 mA of current in current loop 40. With 100% of predetermined charging current, as represented by input voltage Vs, SPAN potentiometer RV1 is used to adjust the gain of the amplifier stages such that the current I1 in current loop 40 is equal to 12 mA. This will result in I1 equaling 20 mA of current with 200% of charging current 32 present. 200% of insulation charging current is generally considered a trip level. To calibrate the unit 38, the calibration control 46 injects test current It into terminal J1-4. A conductor from terminal J1-4 passes through sensing coil 34 to ground terminal J1-3, to simulate various levels of charging current 32. SPAN 93 potentiometer RV1 is the adjustment used to generate the desired current loop output of 12 mA when the simulated charging current It equals that of the insulation system being monitored.

During operation of the high voltage system, it can be shown that extremely high voltage levels can be generated when a disconnect switch supply power to the system is operated. Arcing across the switch contacts generate high current pulses or surges which can flow through the transformer insulation and the transformer ground lead 30. The fast rise times of these pulses and inductance of the ground lead are sufficient to raise the potential voltage of the transformer tank 48 to levels well above ground 10. This voltage exceeds the breakdown voltage between the transmitter electronics 38 and its housing 100. This could cause a failure of the transmitter 38 and the current monitoring system 18. Accordingly, a bipolar surge protector VS1 connected to terminals J1-1 and J1-2 is used to crowbar the high frequency switching surge and pass the current to ground through terminal J1-3, which is connected to the shield of cable 42.

Figure 6:
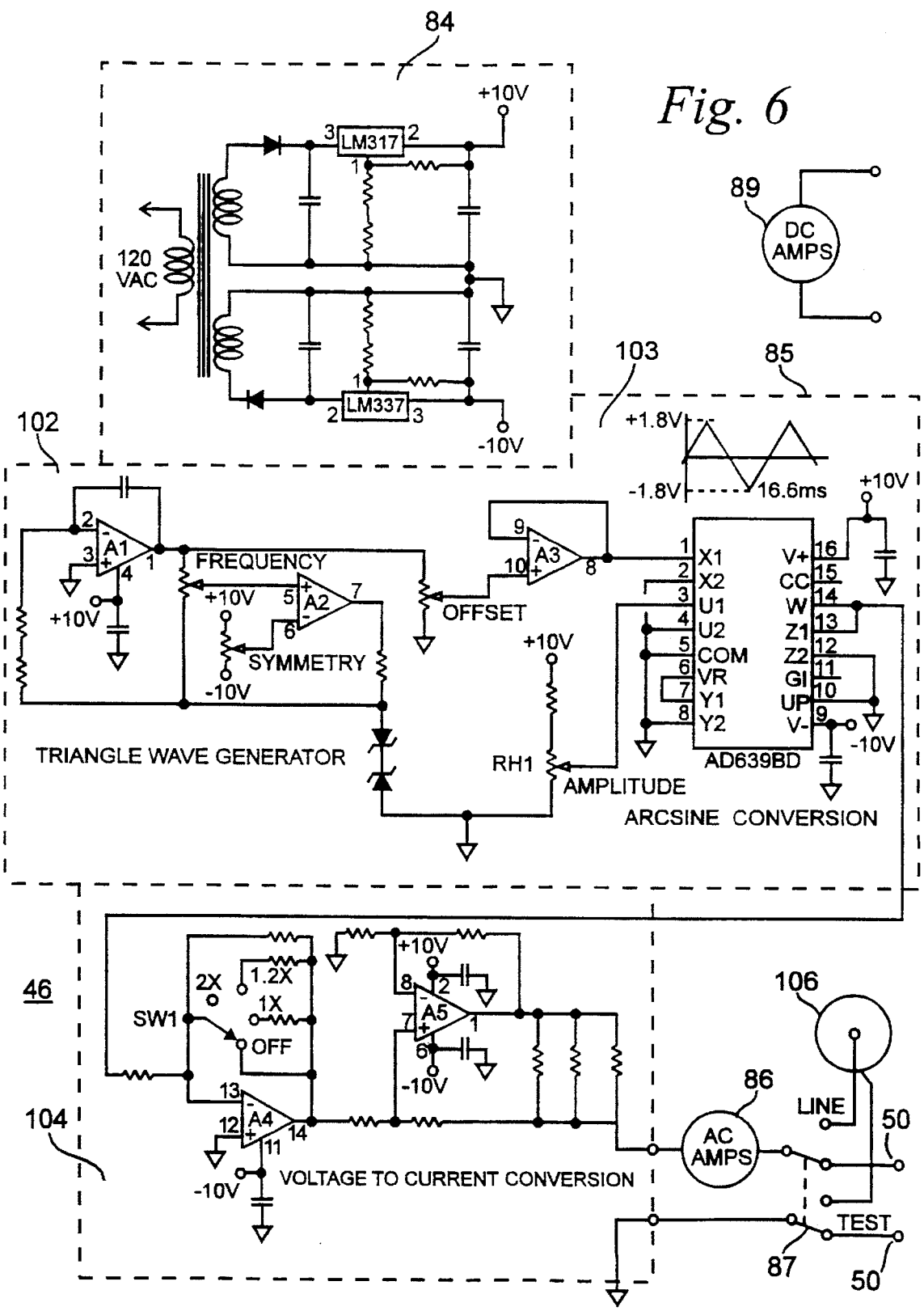
FIG. 6 is a detailed schematic diagram of the calibration module as illustrated in FIG. 6 and the preferred embodiment of the present invention.

The calibration control 46, as detailed in FIG. 6, generates the test currents used to adjust ZERO potentiometer RV3 and SPAN potentiometer RV1. A line powered self-contained power supply 84 provides operating voltages for the current source 85. A free-running triangle wave generator 102 sets the frequency and duty cycle of the AC test current. An universal trig function generator A6, such as an Analog Devices type AD639 converts the triangle waveform to a sine waveform by conversion circuit 103. The output of the conversion circuit is coupled to a voltage to current converter 104. Details of the basic operation of these circuits are well known to those skilled in the art. Switch SW1 selects a particular test current, as will be explained further. Output 105 is coupled to an AC ammeter 86 for displaying the magnitude of the test current. Switch 87 directs the simulated charging current output to either TEST for injecting the current directly to the high voltage apparatus via test winding conductor 50 or to Line to connect to a test probe 106 that allows for testing a insulation current monitor that is uncoupled from the high voltage apparatus. RH1 provides a means for adjusting the amplitude of the test current It.

Most high voltage insulation systems, such as those used in current transformers and on all condenser bushings used on power transformers and circuit breakers, have a capacitance tap provided on all condenser bushings. The capacitance tap is an electrode that provides access to the insulation capacitance for off-line testing and is also occasionally used to measure voltage on-line. A cover protects the capacitance tap and is used to ground the insulation system at the capacitance tap. This cover is more commonly known as a cap-tap cover. The tap connects to the second to last conductive layer of the insulation system and the outermost conductive layer is grounded internally. This creates a capacitive divider between a capacitance C1 from the tap to the high voltage conductor and a capacitance C2 between the tap and ground. Knowing the ratio, C1 to C2, tests can be performed on the high voltage system by applying a known voltage to the tap. During normal operation, the cover shorts out the capacitance C2.

Figure 7:
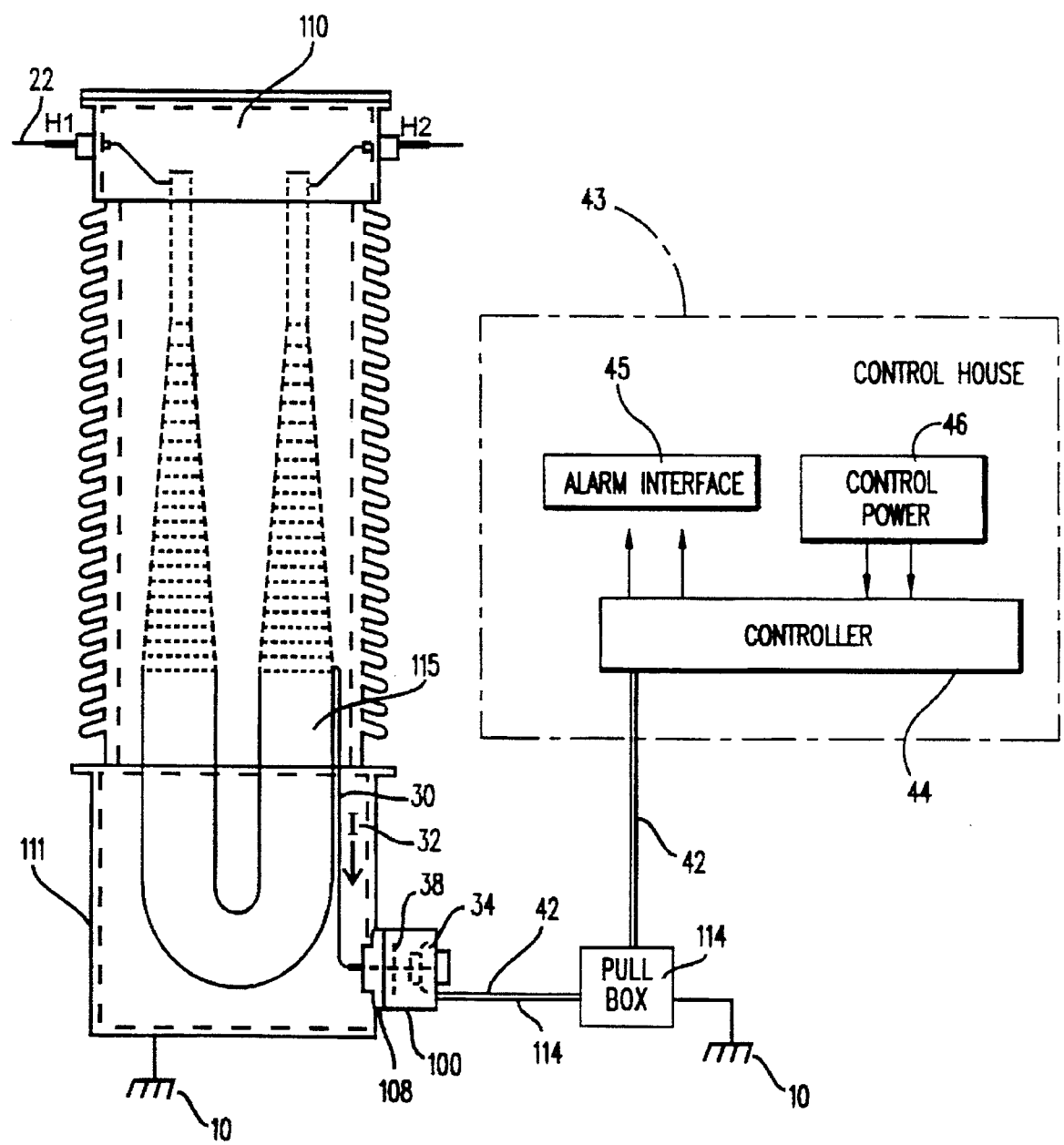
FIG. 7 illustrates a typical installation of the monitoring system of FIG. 3 used on an instrument transformer according to the present invention.

The present invention encloses the sensing coil 34 and transmitter electronics 38 in housing 100, which also serves to ground an insulation capacitance tap 110, just as the cap-tap cover previously described, and as shown in FIG. 7. This housing is used in place of the cap-tap cover and is coupled to the capacitance tap 108 of an instrument transformer 110, which utilizes a step graded foil and paper insulation or capacitive insulation system. The tank 111 is at ground potential 10 and the grounded lead 30 from the insulation system is brought through the tank wall by capacitance tap 108 into the housing 100 and through an internal sensing coil 34 before being electrically grounded to the tank 111 itself. The insulation charging current 32 which flows through conductor 30 is sensed by the sensing coil 34, whose output signal Vs is then coupled to transmitter 38 so as to modulate the current I1 in the control loop 40 coupled by cable 42 through pull box 114 to the controller 44 in the control house 43. Pull box 114 is grounded to ground 10 and provides a means for terminating the shield of cable 42. Cable 42 also contains wire 50 for connecting to a calibration control 46 when it is used.

Transmitter 38 and sensor 34 are both installed internally to Cap-Tap cover housing 100. The controller 44 provides remote power to the transmitter electronics 38 and monitors the charging current levels in the control current loop 40 as previously described. Only a single phase system is shown and would be typical of a retrofit. In addition, FIG. 7 shows the capacitance tap 110 as part of an instrument or current transformer 115. It could also just as easily be part of a circuit breaker having condenser bushings. The housing 100 containing the sensor 34 and transmitter 38 would be adaptable to connecting to any capacitance tap. The bushing provided with the capacitance tap 108 may be connected to a concentric metal electrode or capacitance divider inside the bushing. As an alternative construction, alternating layers of dielectric material, such as paper, and conductive material such as metallized foil are wound around the conductor as shown in FIG. 1.

Figure 8:
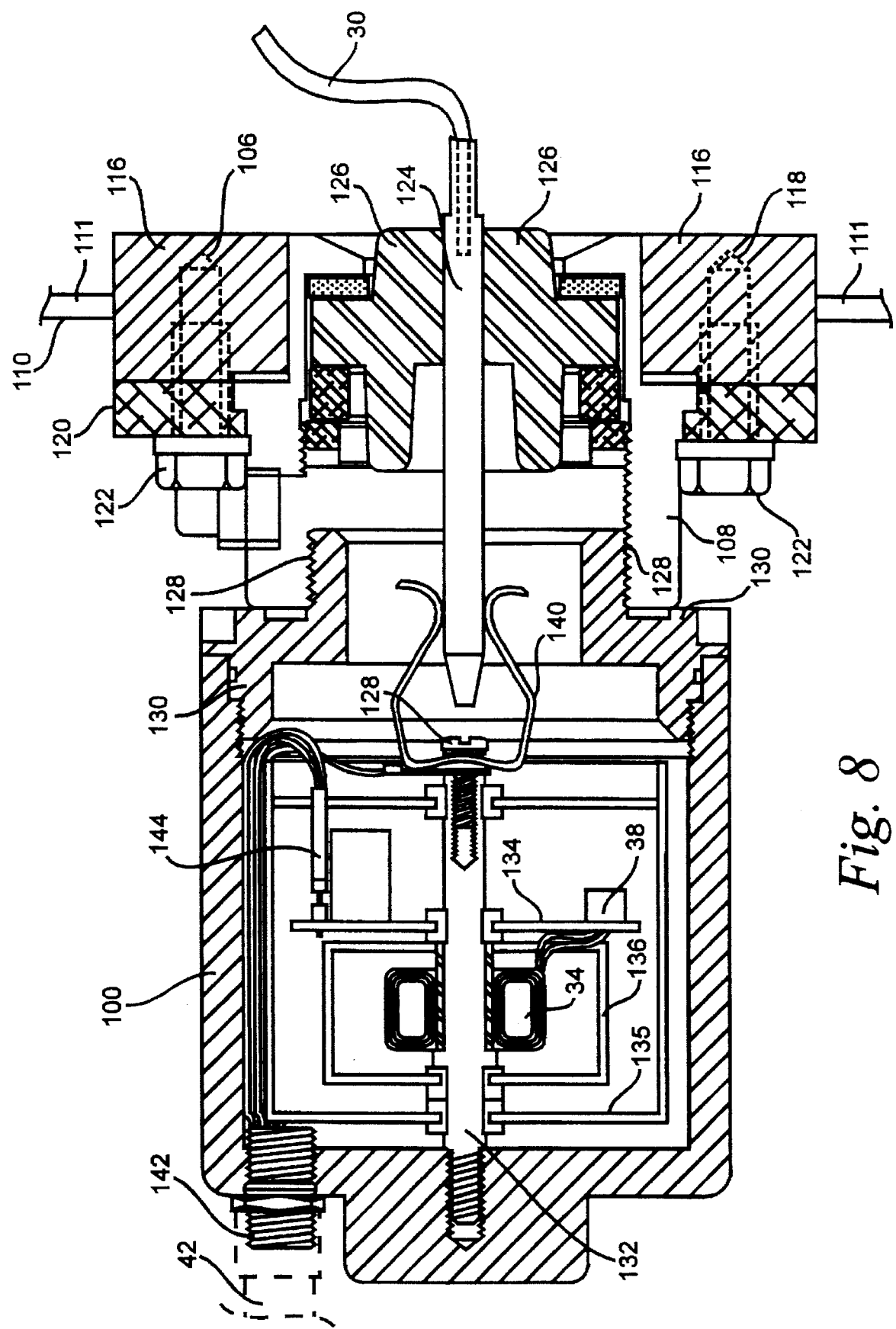
FIG. 8 is a cross sectional view of an enclosure for housing the remote sensor and transmitter illustrated in FIG. 5 of the present invention.

A cross sectional view of the housing 100 for enclosing the sensing coil 34 and transmitter 38 is illustrated in FIG. 8 of the present invention. A flange 116 is welded to the tank wall 111. The flange 116 contains tapped holes 118 for securing and sealing the capacitance tap 108 to the instrument transformer 110 or other types of high voltage equipment by mounting plate 120 and bolts 122. Capacitance tap 108 consists of an electrode 124 which is coupled to the grounded lead 30 from the insulation system and is isolated from the tank wall by isolation bushing 126. This type of capacitance tap is commonly referred to as a "Type A" tap. Coupling a monitoring device to the capacitance tap 108 is normally accomplished by screwing the device into threads 128. Adapter 130 uses these threads 128 to secure the housing 100 to the instrument transformer 110. Internal to the housing 100, a threaded cylindrical rod 132 is attached to housing 100 and is encircled by the sensing coil 34 and provides the means for securing a circuit board 134 containing the transmitter 38. Also attached to rod 132 are magnetic shields 135, 136 for shielding sensing coil 34 and transmitter 38 from potential electrical and magnetic fields generated within and around the instrument transformer 110. Screw 138 mounts a spring contact 140 and a ring lug 142 which is connected to cable 50. An access hole 142 provides a feedthrough for cables 42 and 50 which connects the transmitter 38 to the controller 44 through connector 144.

Previously, when a monitoring device was not attached to the capacitance tap 102, a tap cap cover consisted of a housing with a spring contact attached for mating with the electrode 124. This provided a ground path from the outer conductive layer of the insulation system. With the present invention, rod 132 mates with spring contact 140 when the housing 100 is attached. Thus, the electrical path for the ground current is from the outer conductive layer or foil of the insulation system to the ground lead 30, through the electrode 124 and spring contact 140, through the screw 138 and rod 132, and into the housing 100, which is grounded to the tank wall 111 by the adapter 130 and the capacitance tap 102. The sensing coil 34 therefore senses all ground current from the insulation system. When the calibration control is connected to the system, the test current is injected through the system through test winding conductor 50, ring lug 142, the screw 138 and rod 132, and into the housing 100, which is grounded to the tank wall 111 by the adapter 130 and the capacitance tap 102.

Figure 9:
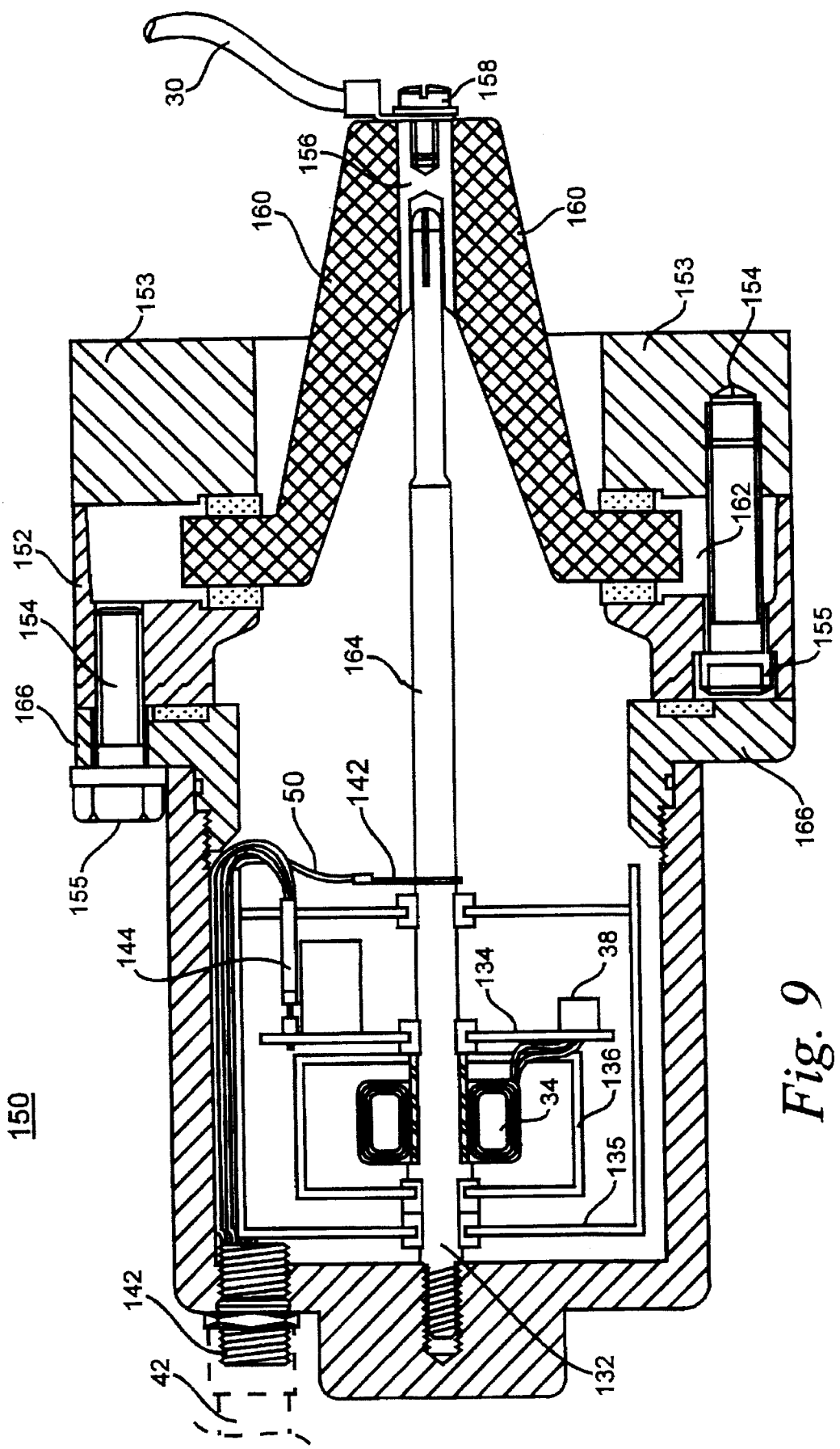
FIG. 9 is a cross sectional view of an alternate enclosure for housing the remote sensor and transmitter illustrated in FIG. 5 of the present invention.

A cross sectional view of an alternative assembly 150 for enclosing the sensing coil 34 and transmitter 38 of the present invention is illustrated in FIG. 9. This type of assembly is used with a "Type B" capacitance tap 152. A flange 153 is welded to the tank wall 111. The flange 153 contains tapped holes 154 for securing and sealing the capacitance tap 152 to the instrument transformer 110 or other types of high voltage insulation equipment by bolts 155. A spring contact 156 is coupled to the grounded lead 30 from the insulation system by bolt 158 and is isolated from the tank wall by isolation bushing 160 and associated filler material 162. A mounting adapter 166 provides the means for attaching the assembly 150 to the capacitance tap 152.

Assembly 150 is identical to housing 100 of FIG. 8 with the exception of spring clip 140 and screw 138. In their place an extension probe 164 is screwed into rod 122. Thus, the electrical path for the ground current is from the outer conductive layer or foil of the insulation system to the ground lead 30, through the bolt 158 and spring contact 156, through the probe 164 and rod 122, and into the housing 150, which is grounded to the tank wall 48 by bolts 155 flange 154. The sensing coil 34 therefore senses all insulation ground current from the instrument transformer 110. The current path for the test current when calibrating is the same, with the test current being injected into probe 164 through ring lug 142 attached to cable 50.

Field calibration of the insulation monitor using the calibration control 46 is accomplished in the following manner, starting with a determination of the nominal or baseline insulation current. This can be accomplished in several ways. If the installation is new, the insulation current 32 can be directly measured if the apparatus is energized at rated voltage and frequency. If the apparatus has a nameplate insulation capacitance listed, the insulation current can be calculated using the formula $$I(\text{ins}) = V(\text{line to gnd}) * 2 * \pi * f * C(\text{ins})$$

V(line to gnd) is equal to the system voltage divided by the square root of 3.

With the high voltage apparatus de-energized, the calibration control switch SW1 is set to the OFF position. The output test current It will be zero, as shown on ammeter 86. Ammeter 89 displays the current loop current I1. In the OFF position, the Zero potentiometer RV3 is adjusted for 4.0 mA of loop current. I1. Control switch SW1 is next placed in the 1× position. The amplitude potentiometer RH1 is adjusted so that It equals the calculated or expected nominal insulation current 32. The SPAN potentiometer RV1 is adjusted to provide 12.0 mA of loop current I1, as indicated by the display of ammeter 89. The apparatus is now calibrated to the high voltage system parameters.

To verify operation of the overall monitoring system, calibration control switch SW1 is placed in the 1.2× position. At this point, the test current It will increase by 20% and the display of ammeter 89 should indicate a loop current I1 of 13.6 mA. The controller 44 should indicate a low alarm condition and contacts 45b should change state. Placing calibration control switch SW1 in the 2× position will increase the test current It by 200% and the display of ammeter 89 should indicate a loop current I1 of 20.0 mA. The controller 44 should indicate a high alarm condition and contacts 45a should change state. It should also be noted that these test currents can be used to adjust the low alarm threshold in the controller 44 as well.

Thus what has been shown is a calibration control that allows for accurate adjust of the various parameters of the insulation monitor. Whereas the monitor can be precalibrated, the nominal calculated insulation current does not account for all of the parasitic capacitance and inductance effects. The only way to achieve an accurate calibration was to repeatedly energize the high voltage apparatus to is normal operating voltage level, read the loop current and guess at the amount of adjustment required to the ZERO and SPAN potentiometers since these adjustments are difficult to make when the apparatus is energized due to the high voltages present when the apparatus is energized. The present invention allows these adjustments to be made without energizing the high voltage apparatus.

While the specific embodiments have been illustrated and described, numerous modifications are possible without departing from the scope or spirit of the invention.

I claim:

1. An insulation monitoring system for a high voltage apparatus having a capacitance tap coupled to an insulation system between a high voltage conductor and earth ground of said high voltage apparatus, said insulation monitoring system comprising:

a. a transmitter module including an AC current sensor for measuring and converting a charging current flowing in said insulation system between said high voltage conductor and earth ground to a first voltage signal proportional to said charging current and an electronic circuit means for converting said first voltage signal to a DC current and modulating a first current signal by said DC current for transmission over said transmission network, said modulated first current signal proportional to said charging current, said transmitter module further including means for coupling a simulated charging current signal through said AC current sensor;

b. an adapter for coupling said transmitter module to said capacitance tap;

c. a transmission network coupled to said transmitter module;

d. a controller coupled to said transmitter by said transmission network to receive said modulated first current signal, said controller for demodulating said modulated first current signal to extract said DC current, converting said DC current to a voltage proportionally to said charging current, comparing said proportional voltage with a preset voltage level, and generating an alarm signal when said proportional voltage exceeds said preset voltage level; and e. a control unit for injecting said simulated charging current signal to said coupling means through said AC current sensor, said control unit for calibrating said insulation monitoring system.

2. The insulation monitoring system of claim 1 wherein said transmission network is a 4–20 milliampere current loop.

3. The insulation monitoring system of claim 2 wherein said AC current sensor comprises a wound toroidal coil assembly responsive to said charging current in a conductor passing through said toroidal coil without disrupting the nature of a source circuit generating said charging current to be measured and said coil assembly further having means, responsive to said charging current, for developing a linearly proportional voltage signal and means for delivering said voltage signal to said transmitter, and wherein said coupling means of said simulated charging current signal is attached to said conductor passing through said toroidal coil.

4. The insulation monitoring system of claim 3 wherein said transmitter further includes means for generating regulated control power from a quiescent current level of 4 milliamperes from said current loop for powering its electronic circuit means.

5. The insulation monitoring system of claim 4 wherein said electronic circuit means in said transmitter further includes means for filtering, amplifying and averaging said first voltage signal to produce said DC current made proportional to said charging current.

6. The insulation monitoring system of claim 5 wherein said filtering, amplifying and averaging means in said transmitter includes a full wave rectifier to generate a full wave rectified voltage proportional to said charging current.

7. The insulation monitoring system of claim 5 wherein said electronic circuit means in said transmitter further includes means for modulating said second signal between the bounding values of 4 milliamperes and 20 milliamperes in response to said charging current with said DC current.

8. The insulation monitoring system of claim 7 wherein said control unit generates a simulated charging current signal to represent a nominal charging current level and a simulated charging current signal to represent a simulated charging current level equal to 200% of nominal charging current, said simulated charging current levels causing said transmitter module to modulate said current loop at 12 milliamperes and 20 milliamperes, respectively.

9. The insulation monitoring system of claim 7 wherein said modulating means includes a comparator which monitors said quiescent current, computes a difference between said quiescent current and a constant reference value and modulates said current loop by an amount equal to said difference and said full wave rectified voltage.

10. The insulation monitoring system of claim 7 wherein said controller coupled to said transmission network further includes means to supply power to said transmitter through said transmission network, means to provide for adjustable alarm threshold levels of said charging current, and means to provide for adjustable time delayed operation of said alarm levels when said alarm threshold levels are exceeded.

11. The insulation monitoring system of claim 10 wherein said control unit generates simulated charging current signals equal to said adjustable alarm threshold levels, said simulated charging current signals to verify operation of said alarm levels when said alarm threshold levels are exceeded.

12. The insulation monitoring system of claim 1 wherein said insulation system is a step-graded insulation system having multiple and alternate layers of conductive and dielectric materials.

13. The insulation monitoring system of claim 12 wherein said insulation system is a capacitive insulation system.

14. The insulation monitoring system of claim 12 wherein said high voltage apparatus is an instrument transformer.

15. The insulation monitoring system of claim 12 wherein said high voltage apparatus is a circuit breaker equipped with high voltage bushings, wherein said capacitance tap is part of said high voltage bushings.

16. The insulation monitoring system of claim 12 wherein said high voltage apparatus is a power transformer equipped with high voltage bushings, wherein said capacitance tap is part of said high voltage bushings.

\* \* \* \* \*